United States Patent
Graesslin et al.

(10) Patent No.: US 8,099,059 B2
(45) Date of Patent: Jan. 17, 2012

(54) METHOD AND CIRCUIT ARRANGEMENT FOR OPERATING MULTI-CHANNEL TRANSMIT/RECIEVE ANTENNA DEVICES

(75) Inventors: Ingmar Graesslin, Boenningstedt (DE); Peter Vernickel, Hamburg (DE); Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 845 days.

(21) Appl. No.: 11/912,684

(22) PCT Filed: Apr. 27, 2006

(86) PCT No.: PCT/IB2006/051311
§ 371 (c)(1),
(2), (4) Date: Oct. 26, 2007

(87) PCT Pub. No.: WO2006/120589
PCT Pub. Date: Nov. 16, 2006

(65) Prior Publication Data
US 2008/0182524 A1   Jul. 31, 2008

(30) Foreign Application Priority Data
Apr. 29, 2005   (EP) .................................. 05103577

(51) Int. Cl.
*H04B 1/38* (2006.01)
*G01V 3/00* (2006.01)

(52) U.S. Cl. ......................... 455/73; 324/318; 324/322
(58) Field of Classification Search .................. None
See application file for complete search history.

(56) References Cited

U.S. PATENT DOCUMENTS

| | | | | |
|---|---|---|---|---|
| 4,829,554 A * | 5/1989 | Barnes et al. | ............... | 455/432.1 |
| 4,935,661 A * | 6/1990 | Heinecke et al. | ........ | 313/231.31 |
| 5,524,275 A | 6/1996 | Lindell | | |
| 5,590,415 A * | 12/1996 | Peltola et al. | ............... | 455/115.1 |
| 5,754,104 A * | 5/1998 | Saito | ............................. | 455/13.3 |
| 6,018,646 A * | 1/2000 | Myllymaki et al. | ........ | 455/115.4 |
| 6,055,418 A * | 4/2000 | Harris et al. | ..................... | 455/91 |
| 6,081,197 A * | 6/2000 | Garrick et al. | ............... | 340/636.1 |
| 6,181,412 B1 * | 1/2001 | Popescu et al. | ............... | 356/4.09 |
| 6,334,069 B1 * | 12/2001 | George et al. | ...................... | 607/2 |
| 6,662,018 B1 * | 12/2003 | Kintis et al. | ................... | 455/522 |
| 6,762,605 B2 | 7/2004 | Brinker et al. | | |
| 6,810,239 B2 * | 10/2004 | Riddle | ........................ | 455/115.1 |
| 2002/0033697 A1* | 3/2002 | Sato | ................ | 324/318 |
| 2002/0123363 A1* | 9/2002 | Hildebrand et al. | ........... | 455/522 |
| 2003/0174018 A1* | 9/2003 | Cooper et al. | ............. | 330/124 R |
| 2004/0121799 A1 | 6/2004 | Chiou | | |
| 2005/0043726 A1* | 2/2005 | McHale et al. | ................... | 606/27 |
| 2005/0134268 A1* | 6/2005 | Zhu | ................ | 324/309 |
| 2005/0260955 A1* | 11/2005 | Bielmeier et al. | .......... | 455/115.1 |
| 2006/0006939 A1* | 1/2006 | Burns et al. | ................ | 330/124 R |

FOREIGN PATENT DOCUMENTS

| | | |
|---|---|---|
| EP | 0827287 A2 | 4/1998 |
| WO | 2005001502 A1 | 1/2005 |

* cited by examiner

*Primary Examiner* — Temesgh Ghebretinsae
*Assistant Examiner* — Gennadiy Tsvey

(57) ABSTRACT

A multi-channel transmit/receive antenna device or arrangement for use in a magnetic resonance imaging (MRI) system includes a power monitoring unit. To ensure that a specific absorption rate of a patient is not exceeded, transmitted power levels and reflected power levels on channels for a plurality of coils and/or coil segments are monitored. Each coil/coil segment is supplied with RF transmit signals with different amplitudes and/or phases and/or waveforms and/or power levels.

12 Claims, 2 Drawing Sheets

Figure 1:
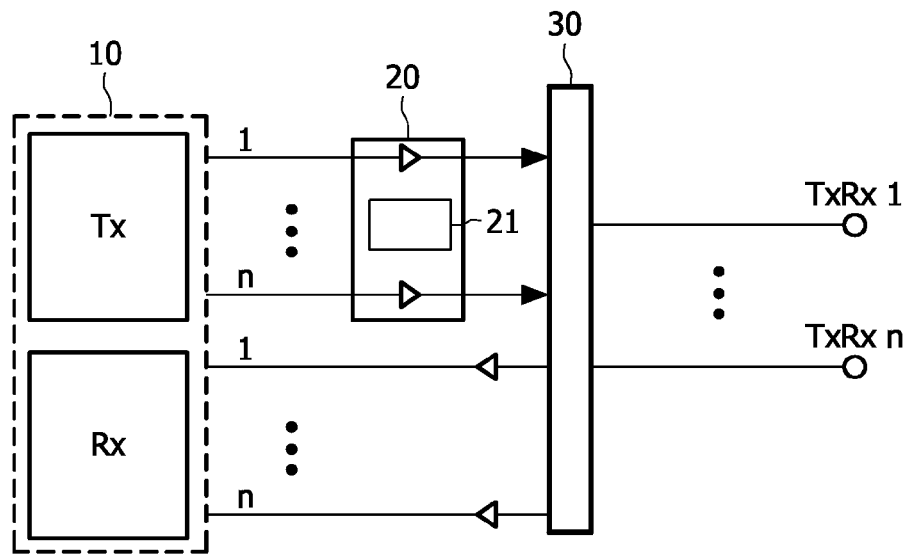

METHOD AND CIRCUIT ARRANGEMENT FOR OPERATING MULTI-CHANNEL TRANSMIT/RECIEVE ANTENNA DEVICES

The invention relates to a method and circuit arrangement for operating a multi-channel transmit/receive antenna device or arrangement, comprising a power monitoring unit, especially for use in a magnetic resonance imaging (MRI) system, as well as such a system.

Multi-channel transmit/receive antenna devices or arrangements comprising a plurality of RF antenna elements like especially RF coils and/or coil segments in a distributed array (which are for example disclosed in EP 1 314 995) offer numerous advantages in comparison to a one-channel RF coil especially when used in a magnetic resonance imaging system.

Such an antenna array makes it possible to generate RF fields ($B_1$ fields) with a certain homogeneous pattern or other distribution of the field strength in order for example to excite nuclei only in a region of interest of a patient or to tailor the field in order to realize arbitrary excitation patterns. Furthermore, special sequences of RF signals, higher field strengths, high flip angles or real-time sequences can be realized and generated by such multi-channel antenna arrangements and multi-dimensional excitations can be accelerated.

However care has to be taken not to exceed a certain specific absorption rate (SAR) of a patient. In order to ensure this, U.S. Pat. No. 6,762,605 discloses a method and a magnetic resonance apparatus comprising at least one transmission antenna in which a current SAR is calculated for a current measurement using stored data and in which planned parameters are modified in order to bring a current SAR value within a predetermined SAR limit.

However, such storing of previous data, calculating of a current SAR and modifying planned parameters may cause a great extent especially in case of a plurality of transmission antennas (i.e. coils and/or coil segments).

One object underlying the invention is to provide a method and a circuit arrangement for operating a multi-channel transmit receive antenna device with which a transmitted RF power can be monitored in order for example not to exceed a certain SAR limit of a patient in an easier and more flexible way.

Another object underlying the invention is to provide a method and a circuit arrangement for operating a multi-channel transmit receive antenna device with which in case of a fault condition for example of a transmit channel or an RF amplifier, any risks for a patient due to undeterminable field conditions can be substantially avoided.

These solutions have the advantage, that for each RF transmit channel a different maximum level of transmitted power can be set without running the risk that a certain power limit applied to an examination object (or SAR of a patient) is exceeded.

Another advantage of this solution is, that not only a maximum power but also a weighted sum of the RF power of the individual channels can be monitored.

The subclaims disclose advantageous embodiments of invention.

Figure 2:
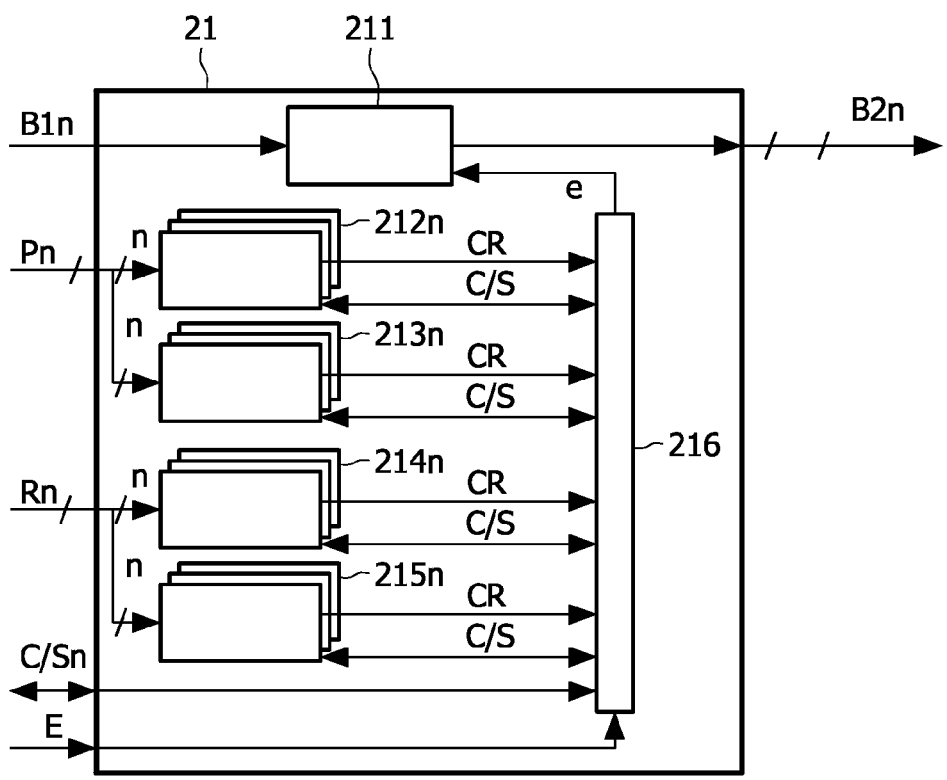
Figure 3:
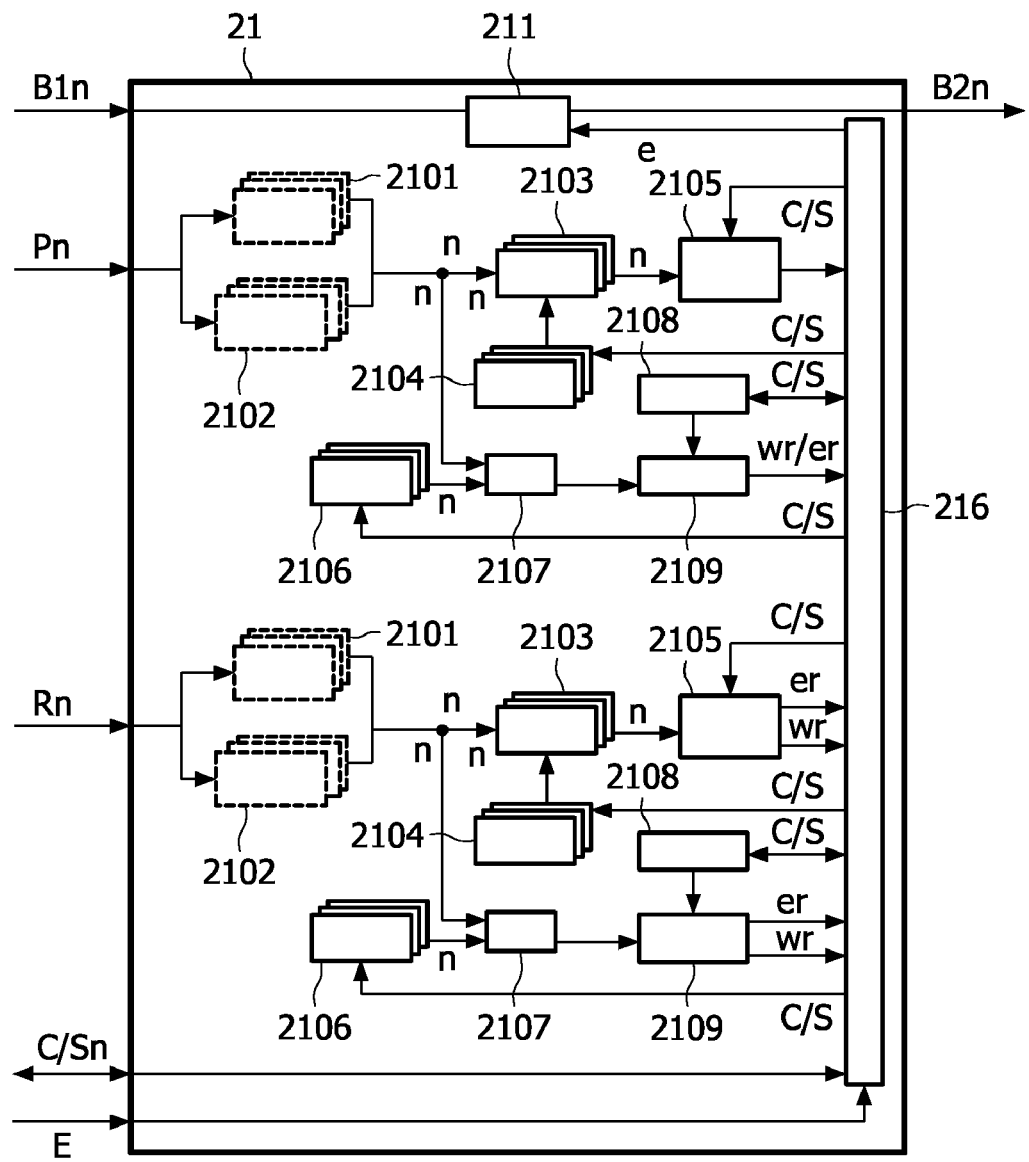

Further details, features and advantages of the invention become obvious from the following description of exemplary and preferred embodiments of the invention with reference to the drawings in which shows:

FIG. 1 a schematic block diagram of a circuit arrangement according to a preferred embodiment of the invention, FIG. 2 a schematic block diagram of a power monitoring unit of the circuit arrangement according to FIG. 1, and FIG. 3 a detailed block diagram of the power monitoring unit according to FIG. 2.

Several multi-channel transmit/receive antenna devices or arrangements which can be operated by a method and circuit arrangement according to the invention are disclosed exemplarily in the above mentioned EP 1 314 995 which is incorporated by reference as a part of this disclosure.

Such an antenna device is especially a RF coil arrangement comprising a number n of RF coils and/or coil segments with different sizes and/or different positions which are each connected to a transmit/receive unit or channel 1, . . . n of a circuit arrangement according to the invention.

FIG. 1 shows a schematic block diagram of a preferred embodiment of a circuit arrangement for operating a multi-channel transmit/receive antenna device, wherein the circuit arrangement is a part of a magnetic resonance imaging (MRI) system and especially of a related multi-channel data acquisition system. The circuit arrangement is exemplarily provided for operating a transmit/receive antenna arrangement comprising n coils (or coil segments) for generating a B1 field and for receiving relaxation signals from an object to be examined.

Substantial components of the circuit arrangement are preferably implemented in a spectrometer 10 in the form of one or more add-on circuit boards. These circuit boards are preferably at least one transmit board Tx and at least one receive board Rx which each comprise a number n of transmit channels and a number n of receive channels, respectively.

The circuit arrangement further comprises a multi-channel RF amplifier 20 (or a number n of one-channel RF amplifiers) with a central power monitoring unit 21. This unit 21 could also be located in the spectrometer 10 or as a separate unit for example in case of using one- or a multi-channel amplifier which is not equipped with such a unit. Finally, a number n of transmit receive switches 30 is provided.

The outputs 1, . . . n of the transmit boards Tx are connected with the inputs of the RF amplifier 20 for amplifying the RF transmit signals which are preferably controlled independently from each other with different and varying phases, amplitudes and/or waveforms. The output signals of the RF amplifier 20 are supplied to the inputs of the n transmit receive switches 30 which are provided for supplying the amplified RF transmit signals to each one coil or coil segment of the antenna device via the input/output ports Tx/Rx 1, . . . Tx/Rx n when switched by a central control or processor unit (not shown) in the transmit mode.

The power monitoring unit 21 is provided for ensuring that a certain predetermined level of a maximum RF power which is transmitted is not exceeded in order for example to limit the specific absorption rate (SAR) applied to a patient. For this purpose the power monitoring unit 21 monitors the power levels of the channels of the amplifier 20. If any of these channels exceeds its preset maximum power limit (which can preferably be different for each channel) or if a weighted sum of the RF power of the individual channels exceeds a preset maximum power limit, the power monitoring unit 21 or a related central control or processor unit can blank all amplifier channels preferably simultaneously.

Other conditions for switching off the amplifier channels are for example environmental conditions like a too high temperature, a fault condition of at least one transmit channel, a power supply failure etc.

Furthermore, the power monitoring unit 21 can be provided for switching off the amplifier channels if for example a reflected RF signal exceeds a predetermined power level because this can indicate a fault condition as well, for example a broken connection to a coil or coil segment of the antenna device, in which case all of the amplifier channels have to be turned off immediately because the generated RF field is unknown and hence not safe in respect of local SAR under such conditions.

The signals which are received by the coils or coil segments (usually relaxation signals) are routed via the input/output ports Tx/Rx 1, . . . Tx/Rx n of the transmit receive switches 30 after switching them into the receive mode by the central control or processor unit to each one of the receive channels of the at least one receive board Rx for digitalization and further processing.

FIG. 2 shows such a power monitoring unit 21 in more details.

Assuming that the antenna device which is operated by the circuit arrangement comprises a number n of coils and/or coil segments (i.e. n channels) which are preferably independently controlled from each other with respect to the amplitude and/or the phase and/or the waveform of the transmitted and/or received RF signals, the power monitoring unit 21 comprises one or a number n of first inputs B1n for blanking signals from the spectrometer 10, a number n of second inputs Pn for transmit or forward RF power from each channel of the RF amplifier, a number n of third inputs Rn for reflected RF power from each channel of the RF amplifier, one or a number n of fourth inputs C/Sn for a control status bus C/S to and from the spectrometer 10 and one or more fifth inputs E for signals representing certain environmental conditions. Furthermore, the power monitoring unit 21 comprises a number n of outputs B2n for submitting blanking signals to each channel of the RF amplifier.

The power monitoring unit 21 comprises an n channel blanking switch 211 (or a number n of one-channel blanking switches) the inputs of which are connected with the first inputs B1n and the outputs of which are connected with the outputs B2n of the power monitoring unit 21, respectively.

A number n of first detection units 212n for a maximum trip level and a number n of second detection units 213n for a sum level are provided, the inputs of which are connected with the second inputs Pn of the power monitoring unit 21.

Furthermore, a number n of third detection units 214n for a maximum trip level and a number n of fourth detection units 215n for a sum level are provided, the inputs of which are connected with the third inputs Rn of the power monitoring unit 21.

Finally, the power monitoring unit 21 comprises a central control unit 216 having each a number n of inputs for comparison results CR of each of the first, second, third and fourth detection units 212n, 213n, 214n, 215n, respectively, and is connected with each of these units via a control status bus C/S. Another input of the central control unit 216 is connected with the fourth input C/Sn of the power monitoring unit 21. The fifth input E of the power monitoring unit 21 is connected with the central control unit 216 for receiving signals representing environmental conditions. An output e of the central control unit 216 is connected with the blanking switch 211 in order to submit an enable signal for enabling the blanking switch 211.

The detection units 212n; 214n for a maximum trip level are provided for comparing for each channel an actual forward and reflected power level, respectively, with related maxima trip levels which are set for each channel independently and preferably with different values, and transmit the comparison results to the central control unit 216. The setting of the trip level for the switch off decision, on the basis of the limits for SAR (patient safety) can be taken from
- the patient weight (entered before an examination)
- assignment of the patient to a group (eg. small, medium, large)
- an initial survey scan with low resolution determining the patient position and the weight.

The measured power and the additional information can be used in a numerical (FEM, FDTD, . . . ) or analytical simulation or in a prediction model (the results of several simulations are stored in memory) to set new RF power levels for each channel and each examination.

The detection units 213n, 215n for a sum level are provided for comparing an actual forward and reflected power level of all channels, respectively, with a maximum sum power level which is set for the forward and reflected power independently, and transmit the comparison results to the central control unit 216.

If one of the comparison results of the detection units 212n; 214n; 213n, 215n indicates that an actual power level exceeds a maximum trip level or an actual sum level exceeds a maximum sum level, the central control unit 216 enables the blanking switches 211 in order to turn off the RF amplifiers 20 simultaneously and immediately via the blanking signals at the outputs B2n.

Because for certain applications like for example measuring calibration data not all coils are in transmit or in receive mode, but some coils are in transmit and other coils are in receive mode, blanking signals are as well provided by the spectrometer 10, which are routed through the power monitoring unit 21. If there is only one first input B1 for blanking signals from the spectrometer 10, all channels are blanked or un-blanked simultaneously. However, it is preferred to provide a number n of first inputs B1n so that individual amplifiers (or channels) can be blanked.

By the above circuit arrangement, the RF power which is applied to a patient can effectively be limited and it is ensured that the specific absorption rate is not exceeded. Especially in the case, in which an antenna device with a plurality of independently operated coils and or coil segments is used and only one of these coils or coil segments fails.

This is especially achieved by not only monitoring a transmitted forward RF power, but also monitoring a reflected power for each channel, i.e. coil and/or coil segment of the antenna device. Furthermore, by additionally or alternatively monitoring sum levels of the forward and/or reflected power the safety for a patient can be improved considerably.

The detection units 212n, 213n, 214n, 215n are preferably provided for converting the input RF signals to DC-signals for further processing. For this purpose, preferably logarithmic amplifiers, digital potentiometers and comparison circuitry based on operational amplifiers are provided.

FIG. 3 shows a preferred embodiment of such a realization of a power monitoring unit 21 as shown in FIG. 2.

The detection units 212n for a maximum trip level of the forward power comprise for each of the number n of channels according to a first alternative an RF to DC converter 2101, 2102 comprising a wide band logarithmic amplifier, and a number of n trip level comparators 2103.

Furthermore, a number n of storages 2104 for a maximum trip level for each channel in the form of a DC voltage (e.g. by a digital potentiometer) set by the central control unit 216 via the C/S bus is provided. The maximum trip levels can preferably be preset independently and with different values in each maximum trip level storage 2104 for each channel.

According to the first alternative, the forward RF power signals of each channel are converted to DC signals by means of a number n of RF to DC converters 2101. The DC signals are then routed to the related trip level comparators 2103 which compare the DC voltages with set maximum trip levels which are stored in the storage 2104 for each channel in the form of a DC voltage.

Instead of this analog processing, the generated DC signals can be further processed according to a second alternative in the digital domain. In this case, for each channel an analog-to-digital converter 2102 is provided which converts the DC signals into digital signals which are each compared in the trip level comparator 2103 with the set trip levels as explained above.

According to a third alternative, high speed analog-to-digital converters together with demodulators can be used instead of the RF to DC converters 2101 in order to convert the forward RF signals to digital signals by means of the so-called direct conversion principle. The digital signals are each again fed to the trip level comparators 2103 for comparing the same with set trip levels as explained above.

The alternative to be chosen depends on certain boundary conditions as well as on the prices of chips available.

The comparison results of the number n of trip level comparators 2103 are supplied to a unit 2105 for evaluating and especially for logically combining these results and for generating a related output signal to the central control unit 216 indicating for example that in at least one of the transmit channels a set level of maximum power is exceeded. In this case the central control unit 216 generates a disable signal e which is fed to the blanking switch 211 in order to turn off at least one of the RF amplifiers as explained above. The unit 2105 is as well controlled by the central control unit 216 via the C/S bus because in a case in which for example not all channels are in transmit mode the logic combination function of the output signals of the comparators 2103 may be altered in order to neglect certain channels.

These detection units 213n for a sum level of the RF forward power comprise a storage 2106 for a number n of weighting factors for each channel for example in the form of potentiometers which are digitally controlled by the central control unit 216, an analog summation unit 2107, a maximum level unit 2108 which is controlled by the central control unit 216 and a logical comparator function unit 2109.

The summation unit 2107 receives the analog or digitized DC signals which have been generated by the units 2101 and/or 2102 by converting the input RF forward power signals, respectively.

These signals are weighted by means of the weighting factors stored in the storage 2106 for each channel and then summed up, before they are submitted to the logical comparator function unit 2109 which has an additional maximum level function which is set by the maximum level unit 2108.

The comparator function unit 2109 is provided to compare the submitted sum signal with one or more warning and/or maximum sum levels which are controlled or set by the central control unit 216.

In case of several such levels the comparator function unit 2109 preferably comprises two or more outputs in order to generate for example a warning signal "wr" that the transmitted RF power levels may soon exceed a set maximum power level so that the spectrometer 10 is enabled to vary the RF signal sequence for example by slightly prolonging it. This would prevent a scan abort and the necessity to repeat a complete scan.

Apart from this, if the sum signal reaches another (larger) predetermined maximum level, an error signal "er" is submitted to the central control unit 216 by which the RF amplifiers are turned off as explained above.

In case of the above mentioned third alternative in which high speed analog to digital converters together with demodulators are used instead of the RF to DC converters these processing steps are as well carried out in the digital domain.

All of the above mentioned set maximum values or levels which can be realized in the form of digital potentiometer values or register values are preferably predetermined and preset prior to an examination, for example during a preparation phase. However, additionally or alternatively, these comparison values or levels can also be changed or adapted during the examination (scan) for example in case of changing conditions.

The detection units 214n for maximum trip levels and the detection units 215n for sum levels which are provided for monitoring the reflected power RF signals (optional second monitoring function) which are applied to the third input Rn of the power monitoring unit 21 are essentially the same as the detection units 212n and 213n, respectively, as explained above. In the following only the substantial differences shall be explained.

In contrary to the above explained transmit (forward) power path (first monitoring function) in which a too high specific absorption rate is monitored, this second monitoring function can be used for detecting fault conditions that may occur as for example a damaged RF cable, a broken coil element, an interruption of the RF chain, significant detuning of the coils and/or coil of elements and so on. In this respect it has generally to be considered that a power coupling between the channels can be the normal running mode or can occur if decoupling measures fail.

However, generally in this reflected power path some reflected power must be allowed, because a perfect matching of the coils and/or coil elements cannot always be assured.

Hence, lower limit values for the maximum trip levels and the sum levels should be defined. If these limit values are not exceeded, the normal working condition is assumed and the reflected power can be subtracted from the forward power in order to obtain the exact power, which is applied to the patient.

All the above explained monitoring steps are preferably conducted on a real-time base at any time but in particular during an examination is active or a patient is present in the MRI system.

Consequently, the power monitoring unit according to the invention is an essential safety component of an MRI system in order to ensure that the limits of the specific absorption rate are not exceeded at any time. Therefore, the power monitoring unit 21 could be replicated by a backup system (second power monitoring unit) using the same inputs as for the first power monitoring unit and informing the latter via the environmental input E in case of a fault condition. Alternatively, two independent paths can be realized and/or a second or separate power supply for every power monitoring unit can be used in order to reduce the probability of failure due to the redundancy.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A circuit arrangement for operating a multi-channel transmit receive antenna device or arrangement, comprising a power monitoring unit for:
monitoring:
   a weighted sum of transmit power levels which are supplied in a plurality of transmit channels to the antenna device or arrangement, and
   a weighted sum of reflected power levels which are reflected in the plurality of transmit channels; and
switching off at least one of the transmit channels if the monitored weighted sum of the transmit and/or reflected power levels exceeds a set maximum weighted sum transmit or reflected power level.

2. The circuit arrangement according to claim 1, wherein the power monitor unit further monitors for:
a transmit power level which is supplied on each transmit channel to the antenna device or arrangement, and
a reflected power level which is reflected on each transmit channel; and
switches off at least one of the transmit channels if the monitored transmit or reflected power level on one or more of the transmit channels exceeds a set maximum transmit or reflected power level.

3. A magnetic resonance imaging system comprising the circuit arrangement according to claim 1.

4. A method of monitoring transmit power levels which are transmitted to each of a plurality of channels of a multi-channel antenna device or arrangement and reflected power levels which are reflected on each of the channels, the method comprising:
(a) setting a limit or maximum transmit power level for each of the channels,
(b) setting a sum transmit limit or maximum power level for the plurality of channels,
(c) setting a limit or maximum reflected power level for each of the channels,
(d) setting a sum reflected limit or maximum power level for the plurality of channels,
(e) detecting and comparing the transmit power level which is supplied by each channel to the antenna device or arrangement with the limit or maximum transmit power level which is set for the channel,
(f) detecting and comparing a sum of the transmit power levels which are supplied in the channels to the antenna device or arrangement with the sum transmit limit or maximum power level, and
(g) detecting and comparing the reflected power level on each of the plurality of channels to the antenna device or arrangement with the reflected limit or maximum power level which is set for the channel,
(h) detecting and comparing a sum of the reflected power levels on the plurality of channels with the sum reflected limit or maximum power level, the sum reflected power level including weighted summing the reflected power levels on each of the plurality of channels, wherein the weighting factors are constant preset factors or adapted during an examination, and
(i) activating an alarm state if
   the monitored transmitted power level on one of the channels exceeds the set limit or maximum transmit power level for the transmit channel, or
   the monitored reflected power level on one of the channels exceeds the set limit or maximum reflected power level for that h channel, or
   the supplied transmit power level exceeds the sum transmit limit or maximum power level, or
   the sum reflected power level on channels exceeds the set sum reflected limit or maximum power level.

5. The method according to claim 4, wherein activating the alarm state includes:
generating a warning or error signal and/or by a turning off or separating at least one of the transmit channels from the antenna device or arrangement.

6. The method according to claim 4, further including:
supplying transmit RF signals with different amplitudes and/or phases and/or waveforms and/or power levels on at least some of the channels, wherein the limit or maximum transmit and/or reflected power levels are set with different values for different channels.

7. The method according to claim 4, wherein the monitored transmit power level and the monitored reflected power level are subtractively combined to determine an RF power level supplied to an examined object.

8. A non-transitory computer-readable medium carrying software which controls one or more processors to perform the method according to claim 4.

9. A power monitor which monitors power levels in a multi-channel magnetic resonance coil system, the monitor comprising:
one or more comparators which:
   compare current transmit power levels of transmit signals on each of a plurality of channels with a preselected maximum transmit power level for each channel, the transmit signals having independently controlled phase and amplitude on each channel, and
   compare current reflective power levels on each of the plurality of channels with a preselected maximum reflected power level for each channel;
a control unit which generates a warning signal in response to:
   the transmit power level on any one of the channels approaching the preselected maximum transmit power level for the one channel, and
   the reflected power level on any one of the channels approaching the preselected maximum reflected power level for the one channel;
a summing unit which generates a weighted sum of the reflected power levels on the plurality of reflected channels; and
wherein the one or more comparators compare the weighted sum of the reflected power levels with a preselected maximum reflected power level sum.

10. The power monitor according to claim 9, further including:
a summing unit which generates a weighted sum of the transmit power levels on the plurality of transmit channels; and
wherein the one or more comparators compare the weighted sum of the transmit power levels with a preselected maximum transmit power level sum.

11. The power monitor according to claim 9, wherein the control unit further determines an amount of power applied by the coil array by determining a difference between the transmitted and reflected power levels.

12. The power monitor according to claim 9, wherein the control unit further generates an error signal in response to the transmit power level on any one of the channels meeting or exceeding the preselected maximum transmit power level or the reflected power level on any one of the channels meeting or exceeding the preselected maximum reflected power level for the one channel.

* * * * *